United States Patent
Johansson et al.

(10) Patent No.: US 9,018,960 B2
(45) Date of Patent: Apr. 28, 2015

(54) METHOD AND DEVICE FOR ENHANCING THE RELIABILITY OF GENERATOR GROUND FAULT DETECTION ON A ROTATING ELECTRICAL MACHINE

(71) Applicants: Henrik Johansson, Vasteras (SE); Joseph Menezes, Vasteras (SE); Stefan Roxenborg, Vasteras (SE); Tord Bengtsson, Vasteras (SE)

(72) Inventors: Henrik Johansson, Vasteras (SE); Joseph Menezes, Vasteras (SE); Stefan Roxenborg, Vasteras (SE); Tord Bengtsson, Vasteras (SE)

(73) Assignee: ABB Research Ltd. (CH)

(*) Notice: Subject to any disclaimer, the term of this patent is extended or adjusted under 35 U.S.C. 154(b) by 0 days.

(21) Appl. No.: 13/972,305

(22) Filed: Aug. 21, 2013

(65) Prior Publication Data
US 2013/0335097 A1 Dec. 19, 2013

Related U.S. Application Data

(63) Continuation of application No. PCT/EP2011/052529, filed on Feb. 21, 2011.

(51) Int. Cl.
*G01R 31/14* (2006.01)
*G01R 31/02* (2006.01)
(Continued)

(52) U.S. Cl.
CPC ............ *G01R 31/025* (2013.01); *G01R 31/343* (2013.01); *H02H 1/003* (2013.01); *G01R 27/18* (2013.01)

(58) Field of Classification Search
CPC .. G01R 31/025; G01R 31/343; G01R 31/024; G01R 31/02; G01R 31/2829; G01R 31/14; G01R 31/088; G01R 31/085; G01R 31/08; G01R 31/086; G01R 19/145; G01R 27/18; H02H 1/003
USPC .............. 324/520, 500, 509–512; 702/75, 58; 340/42, 170
See application file for complete search history.

(56) References Cited

U.S. PATENT DOCUMENTS 4,224,652 A * 9/1980 Fiorentzis ........................ 361/42
4,322,806 A * 3/1982 Allison ............................ 702/76

(Continued)

FOREIGN PATENT DOCUMENTS

CN 101340082 A 1/2009
CN 101414744 A 4/2009

(Continued)

OTHER PUBLICATIONS

International Search Report & Written Opinion of the International Searching Authority Application No. PCT/EP2011/052529 Completed: Nov. 18, 2011; Mailing Date: Nov. 28, 2011 7 pages.

(Continued)

*Primary Examiner* — Patrick Assouad
*Assistant Examiner* — Sean Curtis
(74) *Attorney, Agent, or Firm* — St. Onge Steward Johnston & Reens LLC

(57) ABSTRACT

A method for enhancing the reliability of generator ground fault detection based on a signal injection scheme, wherein the generator includes a winding. The method includes injecting a test signal at a predefined frequency to the winding, measuring an electrical quantity of a response signal in the winding resulted from the injected test signal, and detecting a ground fault based on the measured value of the electrical quantity. The method further includes continuously determining the frequency of the response signal, and discarding the present measured value corresponding to the determined frequency when the determined frequency deviates from the predefined frequency with a first threshold value.

14 Claims, 3 Drawing Sheets

(51) Int. Cl.
*G01R 31/34* (2006.01)
*H02H 1/00* (2006.01)
*G01R 27/18* (2006.01)

(56) References Cited

U.S. PATENT DOCUMENTS

| | | | | |
|---|---|---|---|---|
| 4,914,386 | A * | 4/1990 | Zocholl | 324/545 |
| 5,508,620 | A * | 4/1996 | Pfiffner | 324/545 |
| 5,691,643 | A * | 11/1997 | Ishiguro et al. | 324/510 |
| 5,739,693 | A * | 4/1998 | Pfiffner | 324/509 |
| 6,170,334 | B1 * | 1/2001 | Paulson | 73/587 |
| 7,719,285 | B2 * | 5/2010 | Johansson et al. | 324/509 |
| 2003/0085715 | A1 * | 5/2003 | Lubkeman et al. | 324/509 |
| 2003/0156367 | A1 * | 8/2003 | Macbeth | 361/38 |
| 2006/0125486 | A1 * | 6/2006 | Premerlani et al. | 324/512 |
| 2009/0160454 | A1 * | 6/2009 | Johansson et al. | 324/509 |
| 2013/0030742 | A1 * | 1/2013 | Banerjee et al. | 702/76 |
| 2013/0193979 | A1 * | 8/2013 | Gajic | 324/510 |

FOREIGN PATENT DOCUMENTS

| | | |
|---|---|---|
| CN | 101507072 A | 8/2009 |
| RU | 2330297 C1 | 7/2008 |
| SU | 1348752 A1 | 10/1987 |
| SU | 1698846 A1 | 12/1991 |
| WO | 2010069739 A1 | 6/2010 |

OTHER PUBLICATIONS

Federal Service on Industrial Property—Decision on Grant Application No. 2013138745/28(058740) Issued: Sep. 22, 2014 12 pages.

The State Intellectual Property Office of the People's Republic of China First Office Action Application No. 201180065466.4; Issued: Sep. 3, 2014 6 pages.

* cited by examiner

METHOD AND DEVICE FOR ENHANCING THE RELIABILITY OF GENERATOR GROUND FAULT DETECTION ON A ROTATING ELECTRICAL MACHINE

FIELD OF THE INVENTION

The present invention relates to the field of detecting a ground fault in a rotating electrical machine, wherein the machine includes a winding. The ground fault detection is based on injecting a test signal to the winding of the machine. Particularly, it is related to enhancement of the reliability of such a method under specific but common circumstances.

BACKGROUND OF THE INVENTION

A ground fault in a rotating electrical machine connected to an electrical network may pose a considerable danger for continued operation of the machine. Whereas a single ground fault close to the neutral point may not cause any immediate danger to the machine, the occurrence of the next ground fault will generate large circulating currents that can produce severe damage. To limit ground current at a single ground fault near the terminals, the machine is often grounded via an impedance means to limit mechanical and thermal stresses, thus reducing the resultant damage to the machine. Such a grounding system is often used to provide a means for detecting ground faults within the machine.

One of the existing methods for providing protection for a ground fault is based on signal injection, wherein a test signal is injected at a frequency different from the fundamental system frequency at which a rotating electrical machine is operated. By measuring the change of measured electrical quantities, such as current and/or voltage, resulted by the injected signal, the impedance to ground can be estimated and a ground fault can be detected based on the estimated impedance. However, harmonics are produced by the machine, which, during acceleration and retardation, may coincide with the frequency of the injected signal. A coincidence results in unreliable measurement and thus an unreliable impedance estimation. Consequently, a false protective operation during start and/or stop of the machine may be conducted.

U.S. Pat. No. 5,508,620 describes a method for detecting ground faults on the conductor of an electrical machine, where a measured signal is numerically evaluated. This means that a ground fault resistance is calculated directly in an evaluation unit using the injected voltage and the measured current. However, this measurement principle is only reliable if the injection voltage is a sole source of an injected frequency. Therefore, the system has to be continuously tested to determine whether the injected signal is corrupted by evaluation also during periodic pauses in the injection.

An alternative solution is described in CN101414744, wherein injection signal distortion due to interfering signals during acceleration and deceleration of a generator is avoided by injecting test signals at two different frequencies. Firstly, the generator operation frequency is detected; when the generator operation frequency is more than 10 Hz and less than 40 Hz, the injection power frequency is taken as 100 Hz; when the generator operation frequency is not more than 100 Hz or not less than 40 Hz, the injection power frequency is taken as 20 Hz. By using the dual frequency injection, the method is able to eliminate the signal influence generated by the generator during acceleration and deceleration. However, this solution is rather complicated and requires special hardware and connections. Further, the system needs to be commissioned at both frequencies.

SUMMARY OF THE INVENTION

One object of the present invention is to provide an enhanced method for detecting a ground fault in a rotating electrical machine under specific but common circumstances.

This object is achieved by a method for detecting a ground fault. The method comprises injecting a test signal at a predefined frequency to the winding, measuring an electrical quantity of a response signal in the winding resulted from the injected test signal, continuously determining the frequency of the response signal, discarding the present measured value corresponding to the determined frequency when the determined frequency deviates from the predefined frequency with a first threshold value and detecting a ground fault based on the measured value of the electrical quantity.

By detecting a deviation of the determined frequency of the response signal from the frequency of the injected signal, the invention is able to detect when the frequency of harmonics generated by the machine is getting close to the injected signal. Due to this fact, the invention makes it possible to identify the interference of harmonics generated by the machine during acceleration and retardation. Furthermore, the measured value corresponding to the determined frequency of the response signal will be blocked and not used for detecting a ground fault. In this way, the invention is able to provide a ground protection under some specific but common circumstances, for example during start or stop of the machine without conducting a false protective operation. Therefore, the invention enhances the reliability of such a signal injection based ground fault detection method.

In general, the first threshold should be as small as possible and the minimal size is limited by the accuracy by which the frequency can be determined. More accurate frequency estimations generally take longer time, which, under acceleration or retardation, means that there will be an optimally exact frequency estimation that is dictated by the acceleration or retardation rate.

Preferably, the first threshold value is in a range of 5-100 mHz. It is advantageous that the deviation between the determined frequency of the response signal and the predefined frequency is detected even for small deviations, as this will minimize the possible error.

In various embodiments of the invention, the measured electrical quantity can be either current or voltage. This means that ground fault detection may be based on measured current or voltage values. Alternatively, the method may further comprise estimating values of another electrical quantity based on the measured values of first electrical quantity, for example, an impedance value can be estimated based on the measured current or voltage values and a ground fault can therefore be detected based on the estimated impedance value.

The object of the invention is also achieved by a device for detecting a ground fault. Such a device comprises a signal injection unit configured to inject a test signal at a predefined frequency to the winding of the machine, a measurement means configured to measure an electrical quantity of a response signal in the winding resulted from the injected test signal, and a fault detecting unit configured to detect a ground fault based on the measured value of the electrical quantity. Furthermore, the fault detecting unit is configured to continuously determine the frequency of the response signal, and discard the present measured value corresponding to the determined frequency when the determined frequency deviates from the predefined frequency with a first threshold value.

BRIEF DESCRIPTION OF THE DRAWINGS

The invention will now be explained more closely by the description of different embodiments of the invention and with reference to the appended figures.

DETAILED DESCRIPTION OF THE INVENTION

Figure 2:
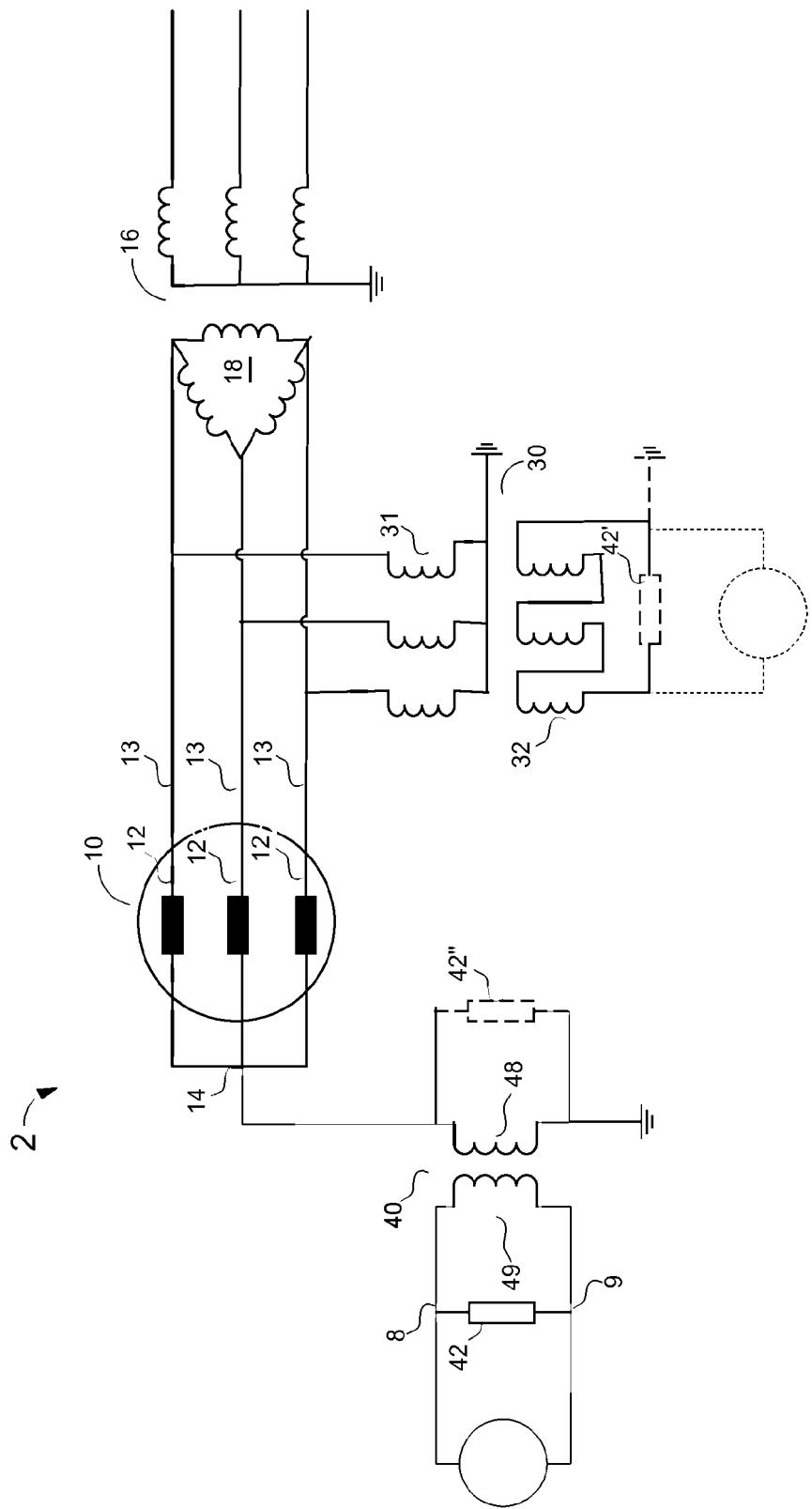
FIG. 2 illustrates a schematic diagram of a device for providing a ground protection for a generator having a stator with windings, wherein a test signal may be injected into different points.

With reference to FIG. 2, a device 2 is arranged for detecting a ground fault of the stator windings of a three-phase generator 10.

Although a generator is exemplified in FIG. 2, it should be understood that the invention is also applicable to other types of rotating electrical machines, for example, a motor.

The generator 10 comprises stator windings 12 having a neutral point 14 and terminals 13 connected to the primary windings of a unit transformer 16.

In this example, the primary windings 18 of the unit transformer 16 are delta-connected to the terminals of the generator for isolating the generator from external faults of the network. The neutral point 14 is connected to a distribution transformer 40 via the primary winding 48 of the distribution transformer 40. The distribution transformer 40 is arranged to provide measurement for the device 2. The generator is further impedance grounded at the neutral point 14 via a neutral resistor 42 placed between the two ends of the secondary winding 49 of the distribution transformer. The device is connected to the neutral resistor 42 through the connection points 8 and 9 to obtain various measurements.

The neutral resistor 42 is adapted to limit ground fault current to a value that limits the generator stator damages in case a ground fault occurs in the stator. This limit is typically in a range of 3-25 A.

Instead of placing the neutral resistor 42 between the two ends of the secondary winding 49 of the transformer, a second possible location is illustrated in FIG. 2, indicated by dot lines as 42'. In this case, the transformer connected to the resistor 42' is a distribution transformer denoted by 30 in FIG. 2, where its secondary winds are open-delta connected. This location establishes another injection point. In this case, the neutral resistor 42' would be connected to the two ends of the secondary windings 32 of the distribution transformer 30 that is connected to the terminals 13 of the stator windings through its primary winding 31. However, it is further possible to place the neutral resistor in other locations such as the one indicated by 42". In this case, the transformer 30 would be a voltage transformer for measuring the zero-sequence voltage.

Figure 3A:
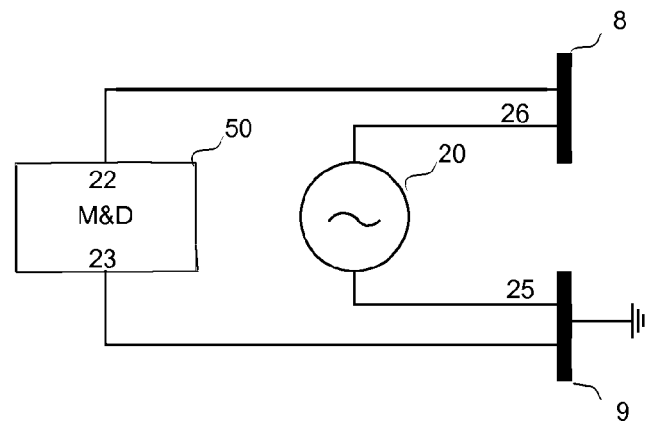
FIGS. 3a-c illustrate schematic diagrams of the device of the FIG. 2, according to three embodiments of the invention.
Figure 3B:
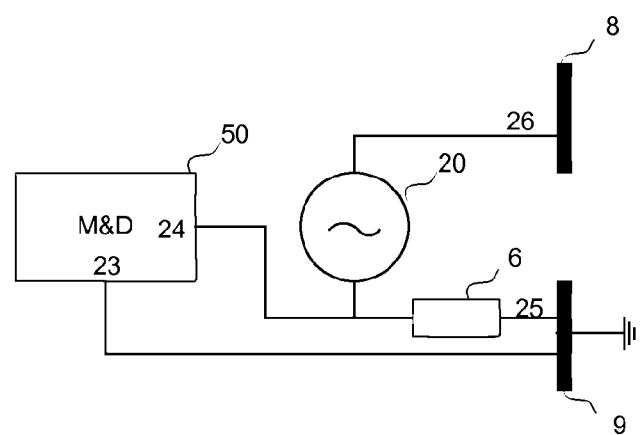
Figure 3C:
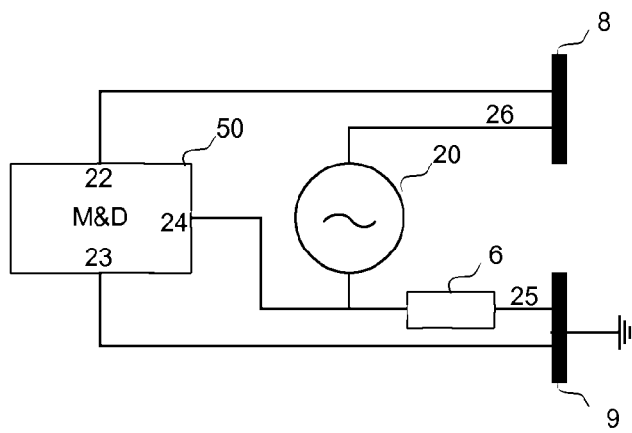

With references to FIG. 3a-c, the device 2 comprises a signal injection unit 20, a measurement and fault-detecting unit 50. The signal unit 20 is arranged to generate a test signal in the form of current or voltage. The generated test signal is injected to the secondary windings 49 of the transformer 40 through the connection points 8 and 9, at step 100 with reference to FIG. 1. Moreover, the test signal is injected with a frequency different from a system frequency.

In any of the above-mentioned cases, the transformer 40, 30 is configured to measure an electrical quantity of a response signal, at step 110. The response of the injected signal is measured at the secondary windings of the transformer 40, 30 through the connection points 8 and 9. The measurement is further communicated to the measurement and fault-detecting unit 50. The measured electrical quantity can be one of current or voltage, or both.

The measurement and fault-detecting unit 50 is configured to determine the frequency of the response signal, step 120. When the determined frequency deviates from a first predefined threshold value, step 135, the present measured value will be discarded, step 140. Therefore, an interference resulted by the harmonics generated by the generator is prevented to be used for detecting a ground fault. The first predefined threshold value is in a range of 5-100 mHz so that the detection is blocked even for very small deviations.

During acceleration or retardation of the generator, there is always a finite chance that a measurement is performed at a moment when an interfering signal is within the threshold. In such a case, no interference is detected and there is a risk of a false protective operation. However, large electrical machines take some time to start and stop, which makes it possible to detect a frequency deviation before an interfering signal comes into the threshold region. Thus, to avoid false action, the ground protection function should be blocked for a short time interval after an interfering signal has been detected. This time interval can be determined by the ratio of the frequency window as defined by the threshold and the nominal frequency multiplied with the longest start or stop time so that the generator frequency is certain to be outside the threshold window after this time interval.

At the other extreme, the generator may start or stop so quickly that it spends a very short time, as compared to the measurement interval, in the region where frequency interference is detected. By chance, it is then possible that a measurement is performed when the frequency deviation is within the threshold. This will give a false reading and no interference indication and thus a chance of false action. To avoid false action, it is therefore required that at least two consecutive measurements indicate fault. As it is required that the generator is changing speed very rapidly to make this scenario possible, there will be no interference at the next measurement.

Figure 1:
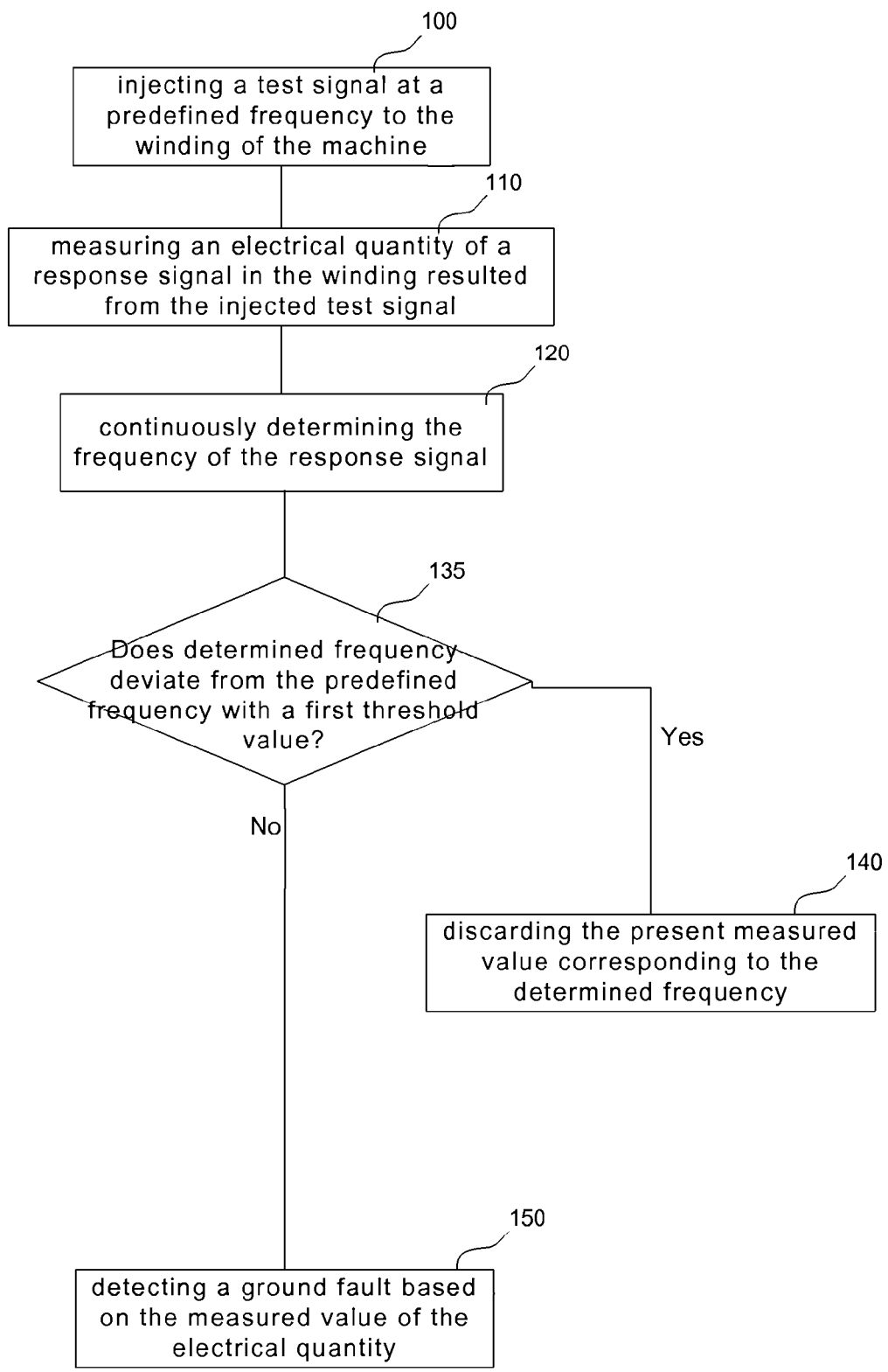
FIG. 1 shows a flow chart of the invented method to enhance the reliability of ground fault detection of a rotating electrical machine by injection, according to one embodiment of the invention.

As shown in FIG. 1, the frequency deviation is monitored at all times, which is a further advantage as false protective actions caused by other disturbances are prevented. Such a disturbance may come from the power system and trigger a frequency deviation and thus results in a risk of initiating a false protective action.

The measurement and fault-detecting unit is further configured to determine a ground fault based on the measured value of the electrical quantity, step 150.

FIGS. 3a, 3b and 3c show schematic diagrams of three embodiments 2a, 2b and 2c of the invented device. In all embodiments, the signal injection unit 20 is configured to inject a test signal via connections 26 and 25. However, measurement of a resultant response signal can be obtained in number of ways.

It should be understood that FIGS. 3a-c illustrate three possible examples, further variants are known. For example, it is possible to have different injection and measurement connection points.

FIG. 3a illustrates that the voltage of the resultant response signal is measured between the connection 22 and 23. This means that the ground fault detection is based on the measured values of the voltage difference between 22 and 23. At an occurrence of a ground fault, the voltage decreases. However, in case that the frequency of the measured voltage deviates from the predefined frequency with the first threshold, the measured values of the voltage will not be used for detecting a ground fault.

The ground fault detection can be based on the current measurement as illustrated in FIG. 3b, wherein a current shunt is established between the output of the injection unit 20 and 9 as a resistor 6. Therefore, by measuring the voltage drop over the current shunt 6, or the voltage difference between the connection points 24 and 23, a current measurement can be obtained. At an occurrence of a ground fault, the current increases.

FIG. 3c is a combination of FIGS. 3a and 3b. This means the ground fault detection can be based on calculated values derivable from the measured current and voltage values. For example, impedance values can be calculated based on the measured current and voltage values. For example, a fault impedance $Z_{fault}$ can be estimated as follows, $$\frac{1}{Z_{fault}} = \frac{1}{Z_m} - \frac{1}{Z_{ref}}$$

wherein $Z_m$ is a calculated impedance value based on the measured current and voltage and $Z_{ref}$ is a reference value. By comparing the estimated fault impedance $Z_{fault}$ with a second predefined threshold value, a ground fault can be determined. In general, when the generator is in a healthy state, this fault impedance is large while during a ground fault, the fault impedance is decreased to close to zero.

What is claimed is:

1. A method for detecting a ground fault in a rotating electrical machine having a system frequency by injection, wherein the machine includes a winding and the method comprises:
    injecting a test signal at a predefined frequency to the winding, where the predefined frequency is different from the system frequency,
    measuring an electrical quantity of a response signal in the winding resulting from the injected test signal,
    detecting a ground fault based on the measured value of the electrical quantity,
    continuously determining the frequency of the response signal, and
    discarding a present measured value corresponding to the determined frequency of the response signal when the determined frequency of the response signal deviates from the predefined frequency of the test signal by threshold value.

2. The method according to claim 1, wherein the threshold value is in a range of 5-100 mHz.

3. The method according to claim 1, wherein the measured electrical quantity is any one of current or voltage.

4. The method according to claim 1, the method further comprising estimating values of a second electrical quantity based on the measured values of first electrical quantity and detecting the ground fault based on the estimated values of the second electrical quantity.

5. A device for detecting a ground fault in a rotating electrical machine having a winding and operating at a system frequency, the device comprising:
    a signal injection unit configured to inject a test signal at a predefined frequency to the winding of the machine, where the predefined frequency is different from the system frequency,
    a measurement unit configured to measure an electrical quantity of a response signal in the winding resulting from the injected test signal, and
    a fault detecting unit configured to detect a ground fault based on the measured value of the electrical quantity, said fault detecting unit configured to:
    continuously determine the frequency of the response signal, and
    discard a present measured value corresponding to the determined frequency when the determined frequency deviates from a predefined frequency of the test signal by a threshold value.

6. The device according to claim 5, wherein the threshold value is in a range of 5-100 mHz.

7. The device according to claim 5, wherein the measured electrical quantity is any one of current or voltage.

8. The device according to claim 5, the fault detecting unit is further configured to estimate values of a second electrical quantity based on the measured values of first electrical quantity and detect the ground fault based on the estimated values of the second electrical quantity.

9. A method for detecting a ground fault in a rotating electrical machine having a winding and operating at a system frequency, the method comprising the steps of:
    injecting a test signal at a predefined frequency into the winding, where the predefined frequency is different from the system frequency,
    measuring an electrical quantity of a response signal in the winding resulting from the injected test signal,
    detecting a ground fault based on the measured value of the electrical quantity and the determined frequency,
    determining the frequency of the response signal over a period of time, and
    suspending the ground fault detection during a time interval when a present measured value of the determined frequency of the response signal deviates from the predefined frequency of the test signal by a threshold value;
    wherein the time interval is determined by a ratio of the threshold and a nominal frequency of the rotating electrical machine multiplied by a maximum acceleration time or a maximum retardation time.

10. The method according to claim 9, wherein the measured electrical quantity is selected from the group consisting of: voltage, current, impedance and combinations thereof.

11. The method according to claim 9, wherein the threshold value is in a range of 5-100 mHz.

12. The method according to claim 9 further comprising the steps of:
    estimating values of a second electrical quantity based on the measured values of first electrical quantity, and
    detecting the ground fault based on the estimated values of the second electrical quantity.

13. The method according to claim 12, wherein the first electrical quantity is either voltage or current, and the second electrical quantity is impedance.

14. A method for detecting a ground fault in a rotating electrical machine having a winding and operating at a system frequency, the method comprising the steps of:
    injecting a test signal at a predefined frequency into the winding, where the predefined frequency is different from the system frequency,
    measuring an electrical quantity of a response signal in the winding resulting from the injected test signal, detecting a ground fault based on the measured value of the electrical quantity and the determined frequency, determining the frequency of the response signal over a period of time, and suspending the ground fault detection during a time interval when a present measured value of the determined frequency of the response signal deviates from the predefined frequency of the test signal by a threshold value, wherein the function of detecting the ground fault is blocked only when at least two consecutive present measured values deviate from the predefined frequency by the threshold value.

\* \* \* \* \*